United States Patent
Lee et al.

(10) Patent No.: US 9,142,644 B2
(45) Date of Patent: Sep. 22, 2015

(54) SEMICONDUCTOR DEVICE AND METHOD FOR FABRICATING THE SAME

(71) Applicant: Hyundai Motor Company, Seoul (KR)

(72) Inventors: Jong Seok Lee, Suwon-si (KR); Kyoung-Kook Hong, Hwaseong-si (KR); Dae Hwan Chun, Gwangmyung-si (KR); Youngkyun Jung, Seoul (KR)

(73) Assignee: HYUNDAI MOTOR COMPANY, Seoul (KR)

( * ) Notice: Subject to any disclaimer, the term of this patent is extended or adjusted under 35 U.S.C. 154(b) by 27 days.

(21) Appl. No.: 14/079,222

(22) Filed: Nov. 13, 2013

(65) Prior Publication Data

US 2014/0183556 A1 Jul. 3, 2014

(30) Foreign Application Priority Data

Dec. 28, 2012 (KR) .................. 10-2012-0157508

(51) Int. Cl.
*H01L 29/772* (2006.01)
*H01L 29/66* (2006.01)
*H01L 29/06* (2006.01)
*H01L 29/78* (2006.01)
*H01L 29/423* (2006.01)

(52) U.S. Cl.
CPC ...... *H01L 29/66666* (2013.01); *H01L 29/0688* (2013.01); *H01L 29/4232* (2013.01); *H01L 29/4236* (2013.01); *H01L 29/42312* (2013.01); *H01L 29/42316* (2013.01); *H01L 29/66734* (2013.01); *H01L 29/66787* (2013.01); *H01L 29/66795* (2013.01); *H01L 29/7802* (2013.01); *H01L 29/7813* (2013.01); *H01L 29/7834* (2013.01)

(58) Field of Classification Search
None
See application file for complete search history.

(56) References Cited

U.S. PATENT DOCUMENTS

2006/0267085 A1\* 11/2006 Matsuura .................. 257/330

\* cited by examiner

*Primary Examiner* — Fei Fei Yeung Lopez
(74) *Attorney, Agent, or Firm* — McDermott Will & Emery LLP

(57) ABSTRACT

The present inventive concept has been made in an effort to increase the width of a channel in a silicon carbide MOSFET using a trench gate.

According to the exemplary embodiment of the present inventive concept, the width of a channel can be increased, compared with the conventional art, by forming a plurality of protrusions extending to the p type epitaxial layer on both sides of the trench.

5 Claims, 6 Drawing Sheets

SEMICONDUCTOR DEVICE AND METHOD FOR FABRICATING THE SAME

CROSS-REFERENCE TO RELATED APPLICATION

This application claims benefit of priority to Korean Patent Application No. 10-2012-0157508 filed in the Korean Intellectual Property Office on Dec. 28, 2012, the entire contents of which are incorporated herein by reference.

TECHNICAL FIELD

The present inventive concept relates to a semiconductor device including silicon carbide (SiC) and a method for fabricating the same.

BACKGROUND

With the recent trend toward large-sized and large-capacity application apparatuses, a power semiconductor device having a high breakdown voltage, a high current capacity, and high-speed switching characteristics has become necessary.

Accordingly, many researches and developments are being conducted on MOSFETs (metal oxide semiconductor field effect transistors) using silicon carbide (SiC), instead of conventional MOSFETs using silicon. Particularly, there is a lot of development of vertical trench MOSFETs.

In the vertical trench MOSFET, a channel is formed in a p type epitaxial layer on both sides of a trench. The width of the channel is proportional to the thickness of the p type epitaxial layer.

The channel width can be lengthened to increase the amount of conduction current; however, the p type epitaxial layer has to be made thicker because the channel width is proportional to the thickness of the p type epitaxial layer, resulting in an increase in the area of the semiconductor device.

The above information disclosed in this Background section is only for enhancement of understanding of the background of the inventive concept and therefore it may contain information that does not form the prior art.

SUMMARY

The present inventive concept has been made in an effort to increase the width of a channel in a silicon carbide MOSFET using a trench gate.

An aspect of the present inventive concept relates to a semiconductor device including: an n+ type silicon carbide substrate; an n− type epitaxial layer, a p type epitaxial layer, and an n+ region sequentially disposed on a first surface of the n+ silicon carbide substrate; a trench penetrating the n+ region and the p type epitaxial layer, disposed on the n− type epitaxial layer, and including a plurality of protrusions disposed on both sides of the trench; a gate insulating film disposed within the trench; a gate electrode disposed on the gate insulating film; an oxide film disposed on the gate electrode; a source electrode disposed on the p type epitaxial layer, the n+ region, and the oxide film; and a drain electrode positioned on a second surface of the n+ type silicon carbide substrate, wherein the plurality of protrusions extend to the p type epitaxial layer.

The protrusions positioned on one side of the trench may be spaced apart from each other.

The plurality of protrusions may be disposed at contact areas between the sides of the trench and the p type epitaxial layer.

An aspect of the present inventive concept encompasses a method for fabricating a semiconductor device, the method including: sequentially forming an n− type epitaxial layer, a p type epitaxial layer, and an n+ region on a first surface of an n+ type silicon carbide substrate; forming a trench by penetrating the n+ region and the p type epitaxial layer and by etching a part of the n− type epitaxial layer; and forming a plurality of protrusions by etching both sides of the trench, wherein the plurality of protrusions extend to the p type epitaxial layer.

The method for fabricating a semiconductor device according to the exemplary embodiment of the present inventive concept may further include: after the forming of a plurality of protrusions, forming a gate insulating film within the trench; forming a gate electrode on the gate insulating film; forming an oxide film on the gate insulating film and the gate electrode; and forming a source electrode on the p type epitaxial layer, the n+ region, and the oxide film, and forming a drain electrode on a second surface of the n+ type silicon carbide substrate.

According to the exemplary embodiment of the present inventive concept, the width of a channel can be increased, compared with the conventional art, by forming a plurality of protrusions extending to the p type epitaxial layer on both sides of the trench.

With the increase in the width of the channel, the channel resistance can be reduced, and the amount of conduction current can be increased.

Moreover, the area of the semiconductor device can be reduced in order to obtain the same amount of current, thus leading to a reduction in production cost.

BRIEF DESCRIPTION OF THE DRAWINGS

The foregoing and other features of the inventive concept will be apparent from a more particular description of embodiments of the inventive concept, as illustrated in the accompanying drawings in which like reference characters may refer to the same or similar parts throughout the different views. The drawings are not necessarily to scale, emphasis instead being placed upon illustrating the principles of the embodiments of the inventive concept.

DETAILED DESCRIPTION

Figure 1:
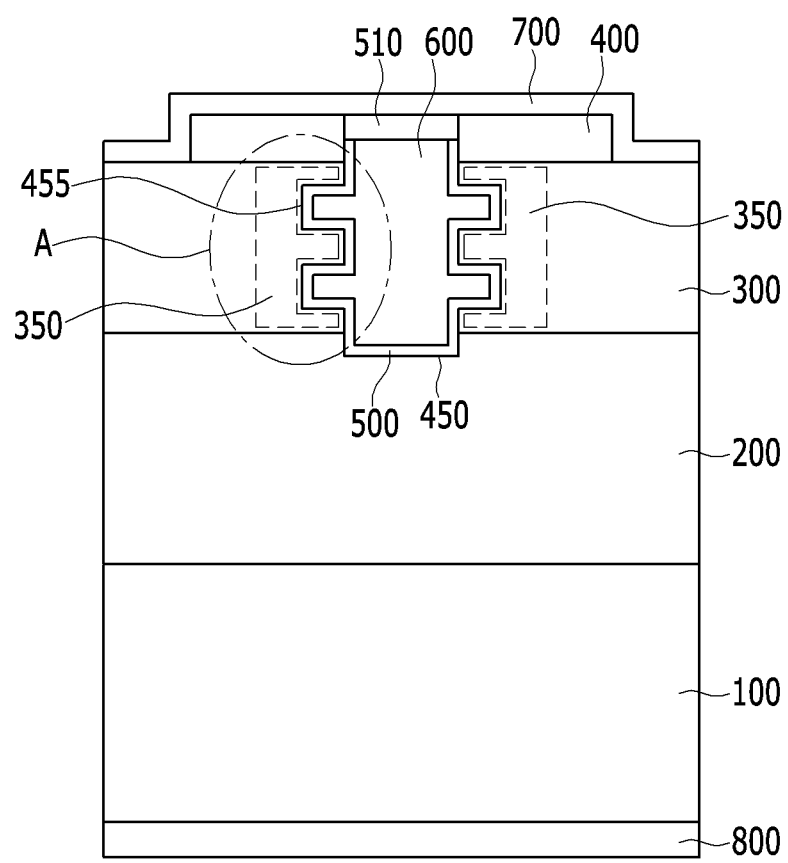
FIG. 1 is a cross-sectional view of a semiconductor device according to an exemplary embodiment of the present inventive concept.

Exemplary embodiments of the present inventive concept will be described in detail with reference to the attached drawings. The present inventive concept may be modified in many different forms and should not be construed as being limited to the exemplary embodiments set forth herein. Rather, the exemplary embodiments of the present inventive concept are provided so that this disclosure will be thorough and complete, and will fully convey the concept of the present inventive concept to those skilled in the art.

In the drawings, the thickness of layers and regions may be exaggerated for clarity. In addition, when a layer is described to be formed on another layer or on a substrate, this means that the layer may be formed on the other layer or on the substrate, or a third layer may be interposed between the layer and the other layer or the substrate. Like numbers refer to like elements throughout the specification.

Figure 2:
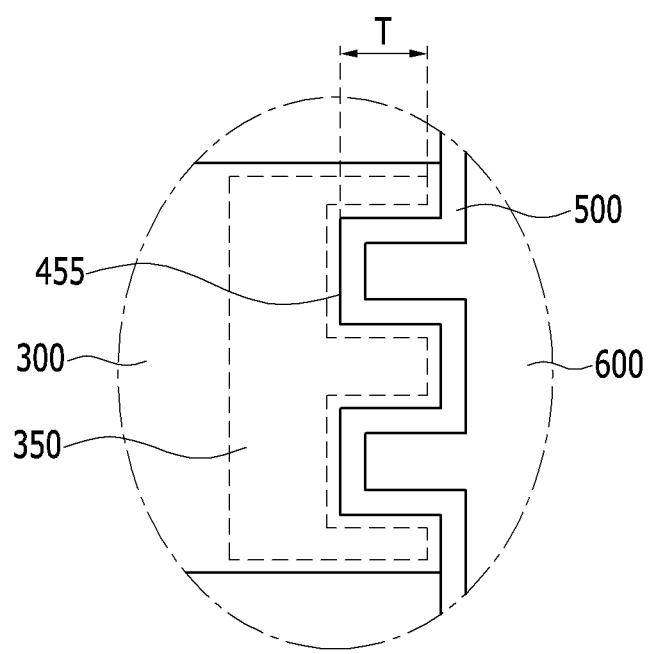
FIG. 2 is an enlarged view of portion A of FIG. 1.

FIG. 1 is a cross-sectional view of a semiconductor device according to an exemplary embodiment of the present inventive concept. FIG. 2 is an enlarged view of portion A of FIG. 1.

Referring to FIG. 1 and FIG. 2, in the semiconductor device according to an exemplary embodiment of the present inventive concept, an n− type epitaxial layer 200, a p type epitaxial layer 300, and an n+ region 400 may be sequentially disposed on a first surface of an n+ type silicon carbide substrate 100.

A trench 450 may be disposed on the n− epitaxial layer 200, the p type epitaxial layer 300, and the n+ region 400. The trench 450 may penetrate the n+ region 400 and the p type epitaxial layer 300. A plurality of protrusions 455 may be disposed on both sides of the trench 450. The protrusions 455 may extend to the p type epitaxial layer 300. That is, the protrusions 455 may be disposed at contact areas between the sides of the trench 450 and the p type epitaxial layer 300. Also, the protrusions 455 positioned on one side of the trench 450 may be spaced apart from each other.

A channel 350 may be disposed in the p type epitaxial layer 300 on both sides of the trench 450. The channel 350 may be in contact with the protrusions 455. As such, the width of the channel 350 may include a circumference of the protrusions 455, and therefore the width of the channel 350 may be increased by twice the length T (see FIG. 2) of the protrusions 455, compared with the conventional art.

A gate insulating film 500 may be disposed within the trench 450, a gate electrode 600 may be disposed on the gate insulating film 500, and an oxide film 510 may be disposed on the gate insulating film 500 and the gate electrode 600. The gate electrode 600 may fill the trench 450.

A source electrode 700 may be formed on the p type epitaxial layer 300, the n+ region 400, and the oxide film 510. A drain electrode 800 may be formed on a second surface of the n+ silicon carbide substrate 100.

In this way, the width of the channel 350 can be increased compared to the conventional art by forming a plurality of protrusions 455 extending to the p type epitaxial layer 300 on both sides of the trench 450.

With the increase in the width of the channel 350, the resistance of the channel 350 can be reduced, and the amount of conduction current can be increased.

Moreover, the area of the semiconductor device can be reduced in order to obtain the same amount of current, thus leading to a reduction in production cost.

Now, a method for fabricating a semiconductor device according to an exemplary embodiment of the present inventive concept will be described in detail with reference to FIGS. 3 to 6 and FIG. 1.

FIG. 3 to FIG. 6 are views sequentially showing a method for fabricating a semiconductor device according to an exemplary embodiment of the present inventive concept.

Figure 3:
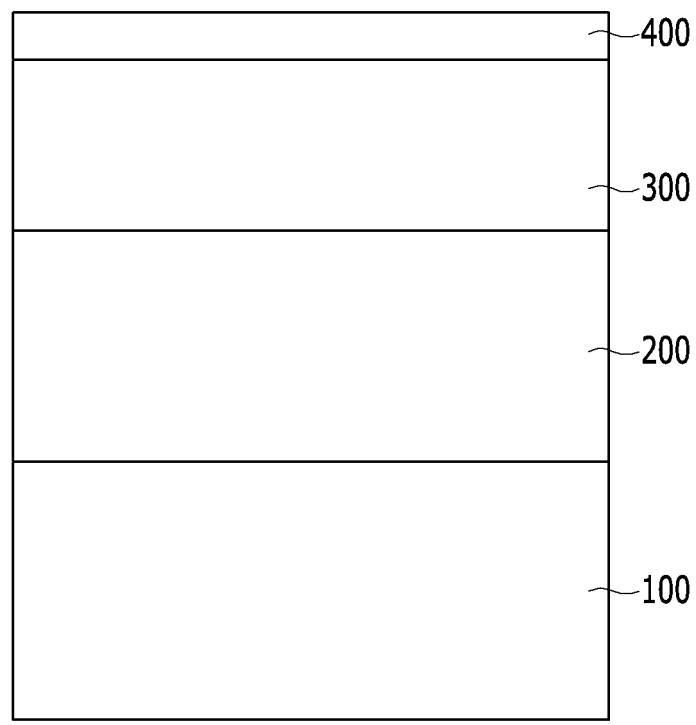
FIG. 3 to FIG. 6 are views sequentially showing a method for fabricating a semiconductor device according to an exemplary embodiment of the present inventive concept.

As shown in FIG. 3, an n+ type silicon carbide substrate 100 may be prepared, then an n− type epitaxial layer 200 may be formed by first epitaxial growth on a first surface of the n+ type silicon carbide substrate 100, then a p type epitaxial layer 300 may be formed by second epitaxial growth on the n− type epitaxial layer 200, and then an n+ region 400 may be formed by third epitaxial growth on the p type epitaxial layer 300.

Although the n+ region 400 may be formed by the third epitaxial growth in the an exemplary embodiment of the present inventive concept, the n+ region 400 may be formed by implanting ions into part of the p type epitaxial layer 300, without performing epitaxial growth.

Figure 4:
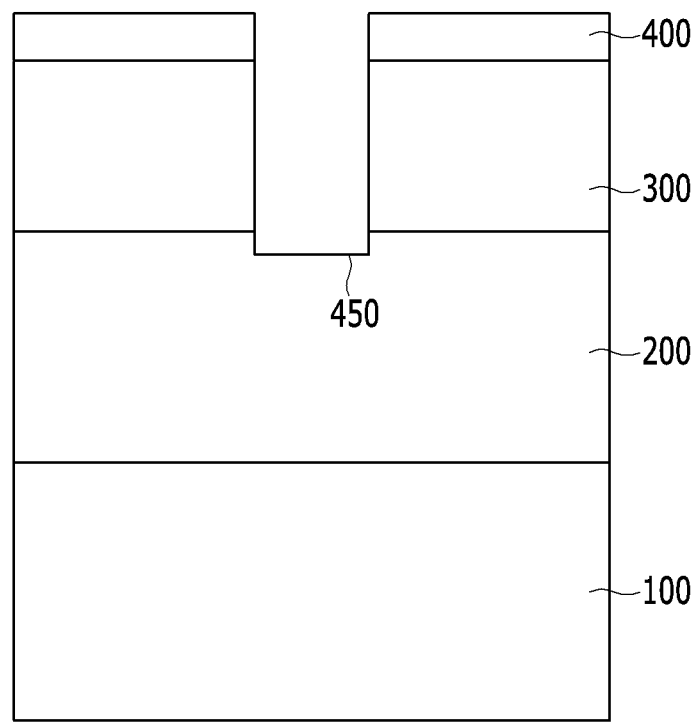

As shown in FIG. 4, a trench 450 may be formed by penetrating the n+ region 400 and the p type epitaxial layer 300 and by etching a part of the n− type epitaxial layer 200.

Figure 5:
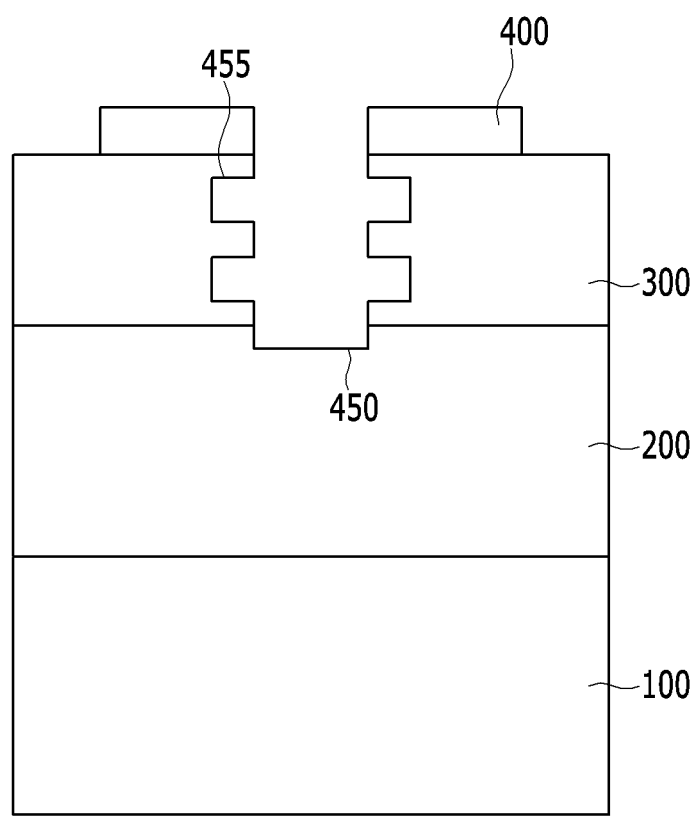

As shown in FIG. 5, a plurality of protrusions 455 may be formed by etching a part of both sides of the trench 450. The protrusions 455 may extend to the p type epitaxial layer 300. That is, the protrusions 455 may be formed at contact areas between the sides of the trench 450 and the p type epitaxial layer 300. Also, the protrusions 455 positioned on one side of the trench 450 may be spaced apart from each other.

Figure 6:
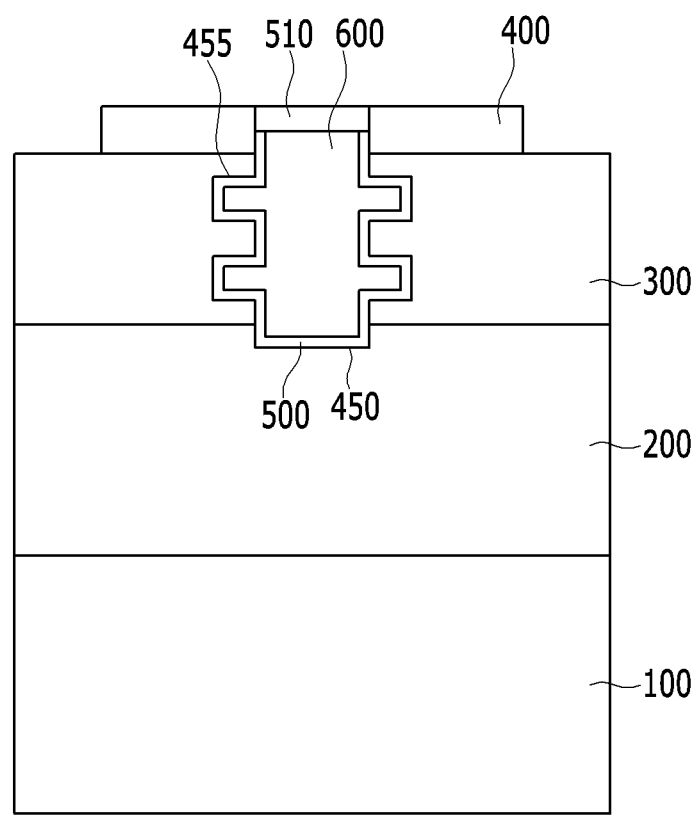

As shown in FIG. 6, a gate insulating film 500 may be formed within the trench 450, and a gate electrode 600 may be formed on the gate insulating film 500. An oxide film 510 may be formed on the gate insulating film 500 and the gate electrode 600. A part of the n+ region 400 may be etched.

A shown in FIG. 1, a source electrode 700 may be formed on the p type epitaxial layer 300, the n+ region 400, and the oxide film 510. A drain electrode 800 may be formed on a second surface of the n+ type silicon carbide substrate 100.

<Description of symbols>

| | |
|---|---|
| 100: n+ type silicon carbide substrate | 200: n− type epitaxial layer |
| 300: p type epitaxial layer | 400: n+ region |
| 450: trench | 455: protrusion |
| 500: gate insulating film | 510: oxide film |
| 600: gate electrode | 700: source electrode |
| 800: drain electrode | |

While this inventive concept has been described in connection with what is presently considered to be practical exemplary embodiments, it is to be understood that the inventive concept is not limited to the disclosed embodiments, but, on the contrary, is intended to cover various modifications and equivalent arrangements included within the spirit and scope of the appended claims.

What is claimed is:

1. A semiconductor device, comprising:
   an n+ type silicon carbide substrate;
   an n− type epitaxial layer, a p type epitaxial layer, and an n+ region, sequentially disposed on a first surface of the of silicon carbide substrate;
   a trench penetrating the n+ region and the p type epitaxial layer, disposed on the n− type epitaxial layer, and including a plurality of protrusions disposed on both sides of the trench;
   a gate insulating film disposed within the trench;
   a gate electrode disposed on the gate insulating film;
   an oxide film disposed on the gate electrode;
   a source electrode disposed on the p type epitaxial layer, the n+ region, and the oxide film; and
   a drain electrode positioned on a second surface of the n+ type silicon carbide substrate,
   wherein the plurality of protrusions extend to the p type epitaxial layer, and
   wherein the protrusions positioned on one side of the trench are spaced apart from each other.

2. The method of claim 1, wherein the plurality of protrusions are disposed at contact areas between the sides of the trench and the p type epitaxial layer.

3. A method for fabricating a semiconductor device, the method comprising:
   sequentially forming an n− type epitaxial layer, a p type epitaxial layer, and an n+ region on a first surface of an n+ type silicon carbide substrate;

forming a trench by penetrating the n+ region and the p type epitaxial layer and by etching a part of the n− type epitaxial layer; and forming a plurality of protrusions by etching both sides of the trench, wherein the plurality of protrusions extend to the p type epitaxial layer, and wherein the protrusions positioned on one side of the trench are spaced apart from each other.

4. The method of claim 3, wherein the plurality of protrusions are disposed at contact areas between the sides of the trench and the p type epitaxial layer.

5. The method of claim 3, further comprising:

after the forming of a plurality of protrusions, forming a gate insulating film within the trench;

forming a gate electrode on the gate insulating film;

forming an oxide film on the gate insulating film and the gate electrode; and forming a source electrode on the p type epitaxial layer, the n+ region, and the oxide film, and forming a drain electrode on a second surface of the n+ type silicon carbide substrate.

* * * * *